(12) United States Patent
Kamath (10) Patent No.: US 7,298,296 B1
(45) Date of Patent: Nov. 20, 2007

(54) REAL-TIME SAMPLE RATE CONVERTER HAVING A NON-POLYNOMIAL CONVOLUTION KERNEL

(75) Inventor: Gautham Devendra Kamath, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/469,853

(22) Filed: Sep. 2, 2006

(51) Int. Cl.
*H03M 7/00* (2006.01)

(52) U.S. Cl. .......................................... 341/61; 341/123

(58) Field of Classification Search ................... 341/61, 341/123
See application file for complete search history.

(56) References Cited

U.S. PATENT DOCUMENTS

| | | | |
|---|---|---|---|
| 5,497,152 A * | 3/1996 | Wilson et al. ................. | 341/61 |
| 5,666,299 A | 9/1997 | Adams et al. | |
| 6,141,671 A * | 10/2000 | Adams et al. ............... | 708/313 |
| 6,208,671 B1 | 3/2001 | Paulos et al. | |
| 6,215,423 B1 * | 4/2001 | May et al. .................... | 341/61 |
| 6,411,225 B1 | 6/2002 | Van Den Enden et al. | |
| 6,535,553 B1 * | 3/2003 | Limberg et al. ............. | 375/232 |
| 6,590,510 B2 | 7/2003 | Woog | |
| 6,747,858 B1 | 6/2004 | Sculley et al. | |
| 6,928,196 B1 * | 8/2005 | Bradley et al. .............. | 382/300 |
| 7,233,268 B1 * | 6/2007 | Lin et al. ....................... | 341/61 |
| 2004/0044715 A1 * | 3/2004 | Aldroubi et al. ............ | 708/490 |
| 2004/0056785 A1 * | 3/2004 | Webster et al. ................ | 341/61 |

* cited by examiner

*Primary Examiner*—Linh Nguyen
(74) *Attorney, Agent, or Firm*—Andrew M. Harris; Mitch Harris, Atty at Law, LLC (57) ABSTRACT

A real-time sample rate converter having a non-polynomial convolution kernel provides reduction in die area and power for performing sample rate conversion in real-time. A non-polynomial convolution kernel, which may be a gaussian operator, is used to determine output sample values from values of an incoming stream of values. If the input sample rate is higher than the output sample rate, the input sample stream is convolved with the gaussian kernel and then decimated to yield the output stream. If the input sample rate is lower than the output sample rate, the input stream is resampled to a small multiple of the output sample rate and convolved with the gaussian kernel to produce the output sample stream directly.

24 Claims, 6 Drawing Sheets

REAL-TIME SAMPLE RATE CONVERTER HAVING A NON-POLYNOMIAL CONVOLUTION KERNEL

BACKGROUND OF THE INVENTION

1. Field of the Invention

The present invention relates generally to digital audio and audio-video systems, and more specifically, to a real-time sample rate converter and method that use non-linear and non-polynomial convolution coefficient operation to perform the conversion.

2. Background of the Invention

Real-time sample rate converters and sample rate conversion algorithms are pervasive in digital audio and digital audio-video (AV) systems. Frequently, the playback digital audio sample rate of an audio reproduction system or storage system does not match the digital audio sample rate of a pre-recorded program, and the audio data must be converted to the required sample rate before playback and/or storage. The ratio between the source sample rate and the desired sample rate may be irrational and/or time-varying, requiring what is known as asynchronous sample rate conversion. The ratio may also not be known in advance, requiring adaptability over a range of sampling rates and sampling rate ratios.

Sample rate converters perform conversion of the sample rate by calculating the value of each sample at the new rate from the values surrounding each new-rate sample in time from the source audio stream. The simplest form of sample rate conversion is linear interpolation that locates the new sample value on a line projected between the two source audio samples that immediately surround the calculated value in time. Such interpolation has a large amount of harmonic distortion due to error between the calculated value and the actual value.

Audio program information is typically very non-linear and can be generally viewed as a waveform comprising multiple superimposed sinusoids of differing frequencies. Therefore, higher-order polynomials that involve samples outside of the two-sample window surrounding the calculated sample are employed to refine the estimation of the ideal new sample value. The error level can be arbitrarily reduced by increasing the order of the polynomial function used for the estimation, with an increasing penalty in computation time and storage for the source samples surrounding the current time. Such conversion is typically performed by a time-variant interpolation filter having a large number of taps, which requires a large amount of computation power, as well as storage for a large number of coefficients. The result is a large amount of die area/processor time and consequent power consumption, in order to perform the sample rate conversion. The number of taps required for the filter may be reduced, resulting in reduced power consumption, using infinite-impulse response (IIR) filters. However, the phase-response of such filters results in non-linear group delay.

Alternative solutions, such as that disclosed in U.S. Pat. No. 6,208,671, convert the incoming sample stream to a higher "intermediate" sample rate, and then converts the intermediate result to the desired output sample rate. Such solutions require an interpolation filter, a decimation filter and a high-speed interpolator. The application of high intermediate sample rates require circuits that also consume large amounts of circuit power.

Therefore, it would be desirable to provide a real-time method and sample rate converter providing a sample-rate converted output stream with minimum harmonic distortion, linear phase response, and low circuit power/computation cost.

SUMMARY OF THE INVENTION

The above stated objective of providing a low-distortion real-time sample rate converter with linear phase and low circuit power/computation cost is achieved in a sample rate converter and method of operation of the sample rate converter.

The sample rate converter converts an input sample stream to an output sample stream using a non-polynomial convolution kernel, which may be a gaussian function, to provide for sample rate conversion at a low intermediate sample rate. Since the gaussian function decays rapidly with displacement from its center of symmetry, the convolution can be truncated after a small number of terms, i.e., the convolution can be performed using only a small number of input samples, without generating unacceptable distortion.

For incoming sample rates higher than the output sample rate, interpolation is applied by directly convolving the input sample stream with the non-polynomial kernel and then decimating the output of the convolution to the output sample rate. For incoming sample rates lower than the output sample rate, the input sample stream is first resampled at a small multiple of the output sample rate and then the sample values are convolved with the gaussian kernel at the output sample rate. When the sample rates match, either of the above-described methods/circuits may be applied.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a real-time sample-rate converter and real-time sample rate conversion method that employ a non-traditional sampling kernel in order to reduce the amount of hardware and/or computation power required to perform a sample rate conversion of specified accuracy. Instead of a linear polynomial kernel, as is employed in prior art converters, a transcendental function, i.e., a function that cannot be exactly expressed as a polynomial, is employed. The magnitude of the kernel value varies with the time displacement of each sample involved in the convolution, non-linearly and according to a non-polynomial function. The time displacement is with respect to a reference time position, generally the time corresponding to the sample position of the output sample being calculated.

In the embodiments described below, a gaussian kernel is employed, which is a non-linear and non-polynomial function. An approximation having a substantially gaussian shape could also be used. The gaussian kernel is symmetric about zero, which is desirable for fixing the position of the output sample at zero. The symmetry is desirable as artifacts would otherwise be introduced in the output sample stream. The gaussian kernel provides a particular advantage in that for a finite number of terms and/or finite precision in computation, the spread of the distortion in both the frequency-domain and time-domain is equal and the product of the time-domain and frequency-domain spreading due to error is minimal. The gaussian kernel can be computed with a simplified coordinate rotation digital computer (CORDIC) algorithm that uses a logarithmic look-up table. The CORDIC algorithm is advantageous in that the logarithmic look-up table extends over a short interval ln [1]:ln [2], and the depth and width of the table required to provide the required precision of the computed convolution result is small. For the CORDIC look-up table, both the depth and width are proportional to the required precision of the look-up values. The look-up value precision is only slightly greater than the required precision of the result, since the look-up values are only added a few times to produce the final term. CORDIC algorithms can be used to compute other transcendental functions that may be usefully applied as kernels in the sample-rate converter of the present invention, depending on the metrics required from the sample-rate converter.

Figure 1:
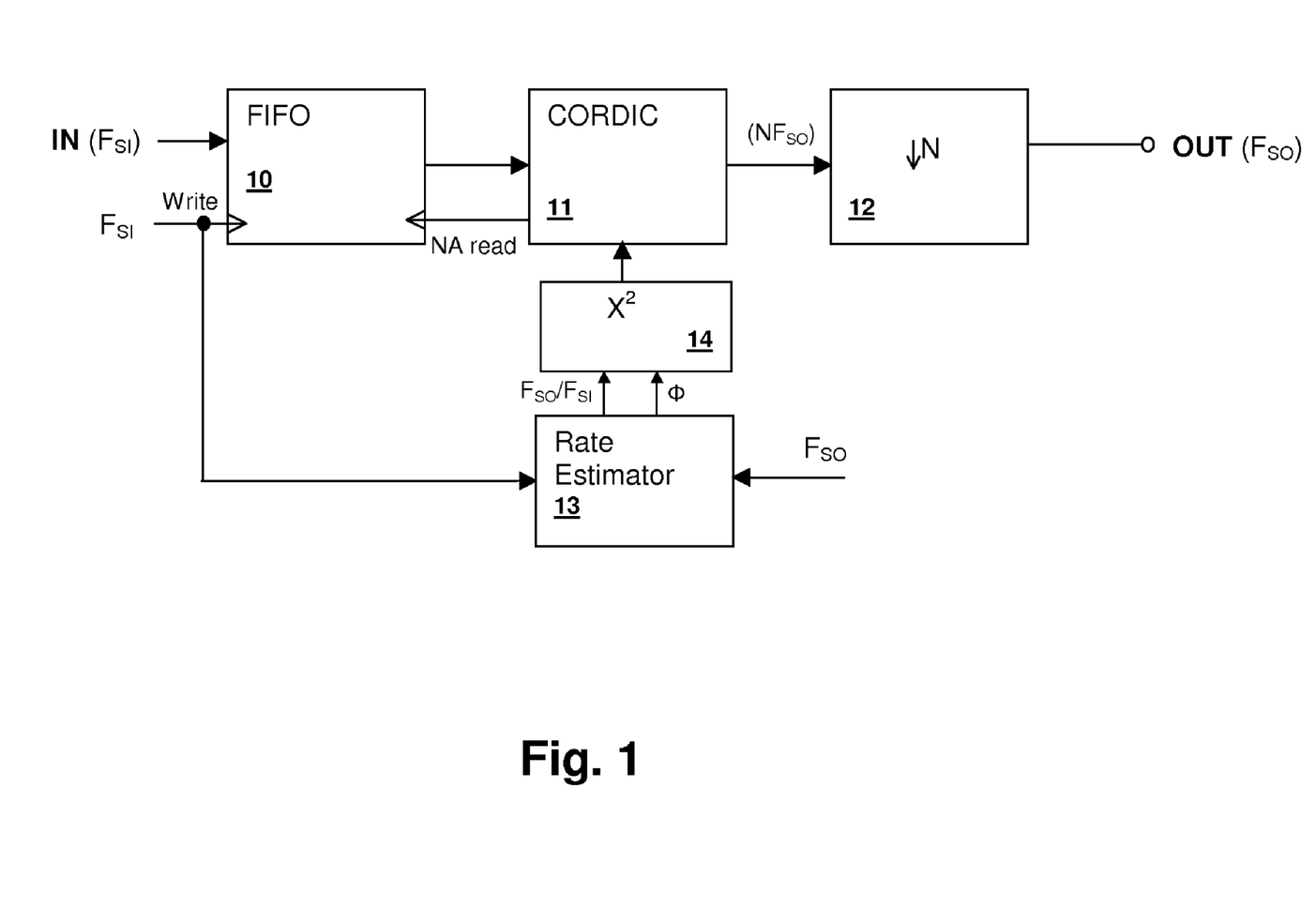
FIG. 1 is a block diagram depicting a sample-rate converter in accordance with an embodiment of the present invention.

Referring now to FIG. 1, a block diagram of a sample-rate converter in accordance with an embodiment of the present invention is shown. The depicted embodiment is applicable when the source sample rate is higher than or equal to the desired output sample rate and may form part of a converter that supports output/input sample rate ratios greater than and less than one, as will be shown below with respect to the embodiment of FIG. 3.

An input sample stream $IN(F_{SI})$ at a first sample rate $F_{SI}$ is received by a FIFO 10. FIFO 10 is an addressable FIFO that is accessed by CORDIC processing circuit 11, that may be a digital signal processor (DSP) executing a CORDIC algorithm, or a hardware CORDIC implementation. CORDIC processing block 11 reads a predetermined number of input values from FIFO 10 for each output stream value to be computed and performs a convolution with the gaussian kernel by computing the value of the gaussian kernel for each input value from the displacement of the input value from the midpoint of the set of input values read from FIFO 10, the phase number of the current sample and sample-rate ratio as provided from a rate estimator 13. The read signal, labeled "NA read" is a non-advancing read so that CORDIC processing block 11 can access the number of samples required to perform the convolution term summation for each output of CORDIC processing block 11.

Rate estimator 13 compares the phase of the input sample clock at rate $F_{SI}$ to an output sample clock at rate $F_{SO}$ to produce the instantaneous phase $\Phi$ and sample rate ratio $F_{SO}/F_{SI}$ as fixed-point numbers. A squaring unit 14 provides the square of the time displacement used by the CORDIC kernel to compute the present output sample. The output samples are given by:

$$\sum_{n-j}^{n+j} a[n]e^{-kt^2}$$

where 2j+1 is the size of the set of input samples used to provide the convolution terms, a[n] is the sequence of magnitudes of the input samples, and $-t^2$ is the output of squaring unit 14. The constant k is a positive constant and is determined by the spread of the gaussian kernel with respect to the spread of the input samples as will be described in further detail below. In the actual algorithm employed in CORDIC processing block 11, a constant k' is a constant equal to $k\log_2 e$, which permits the use of a base 2 logarithm to compute the gaussian in CORDIC processing block 11, which are computed by:

$$\sum_{n-j}^{n+j} a[n]2^{-k't^2} = \sum_{n-j}^{n+j} a[n]e^{-kt^2}$$

yielding the identical result given above.

The output of CORDIC processing block 11 is a stream of intermediate samples at an integer multiple N of the output sample rate. A decimation filter 12 decimates the intermediate sample stream to provide an output sample stream at rate $F_{SO}$. The number of input samples and thus convolution terms that are employed in each output sample computation is dramatically reduced over that of traditional sample rate converters, that may include hundreds of interpolation filter taps. Since the gaussian function decays super-exponentially, for a given error in the output sample magnitudes, only a small number of convolution terms, e.g. +/–5 samples around the midpoint of the convolution, will yield a high level of precision in the output sample stream. In general, the number of terms required is proportional to the natural logarithm of the allowable truncation error.

Figure 2:
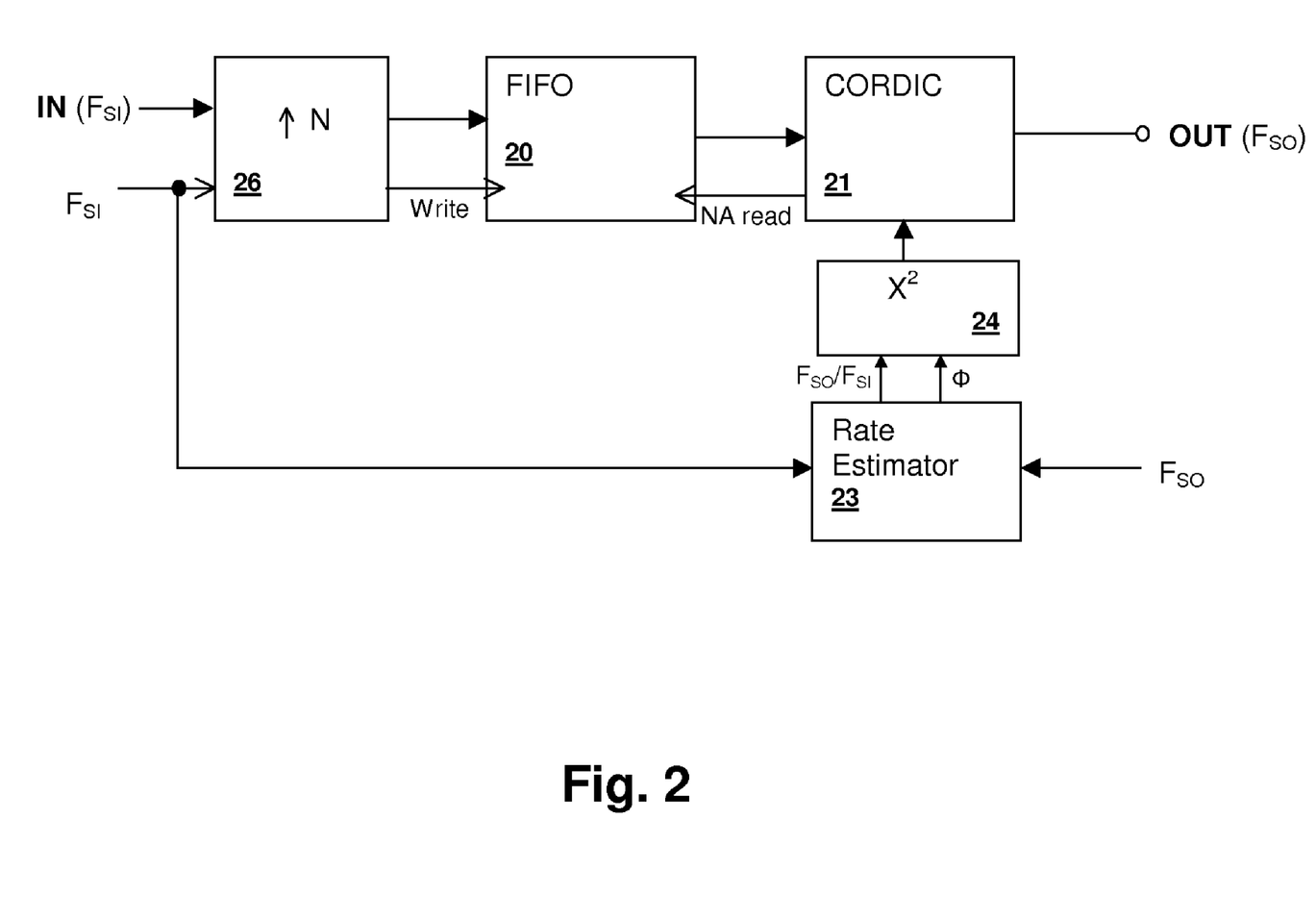
FIG. 2 is a block diagram depicting a sample-rate converter in accordance with another embodiment of the present invention.

Referring now to FIG. 2, a block diagram of a sample-rate converter in accordance with another embodiment of the present invention is shown. The depicted embodiment is applicable when the source sample rate is lower than or equal to the desired output sample rate and may also form part of a converter that supports output/input sample rate ratios greater than and less than one, as mentioned above.

An input sample stream $IN(F_{SI})$ at a first sample rate $F_{SI}$ is up-sampled by an interpolation filter 26 to an intermediate sample stream at rate $NF_{SI}$. Interpolation filter 26 can be a very simple filter compared to those required for arbitrary sample rate conversion, and may be specifically designed for a predetermined upsampling ratio of N:1. The output of interpolation filter 26 is provided to a FIFO 20, which is an addressable FIFO that is accessed by CORDIC processing block 21, that may be a digital signal processor (DSP) executing a CORDIC algorithm, or a hardware CORDIC implementation. CORDIC 21 reads a predetermined number of input values from FIFO 21 for each output stream value to be computed and performs a convolution with the gaussian kernel by computing the value of the gaussian kernel for each input value from the displacement of the input value from the midpoint of the set of input values read from FIFO 21, and the phase number of the current sample and sample-rate ratio as provided from a rate estimator 23.

Rate estimator 23, a squaring unit 24 and CORDIC processing block 21 operate as described above with respect to FIG. 1, except that the convolution performed by CORDIC processing block 21 occurs directly at output sample rate $F_{SO}$ from the up-sampled intermediate stream values, rather than producing an up-sample output intermediate stream from the input stream values as in the circuit of FIG. 1. Since the output sample rate exceeds the input sample rate, the input stream of values would otherwise not meet the required input of CORDIC processing block 21 needed to provide for computation of output data stream OUT.

Figure 3:
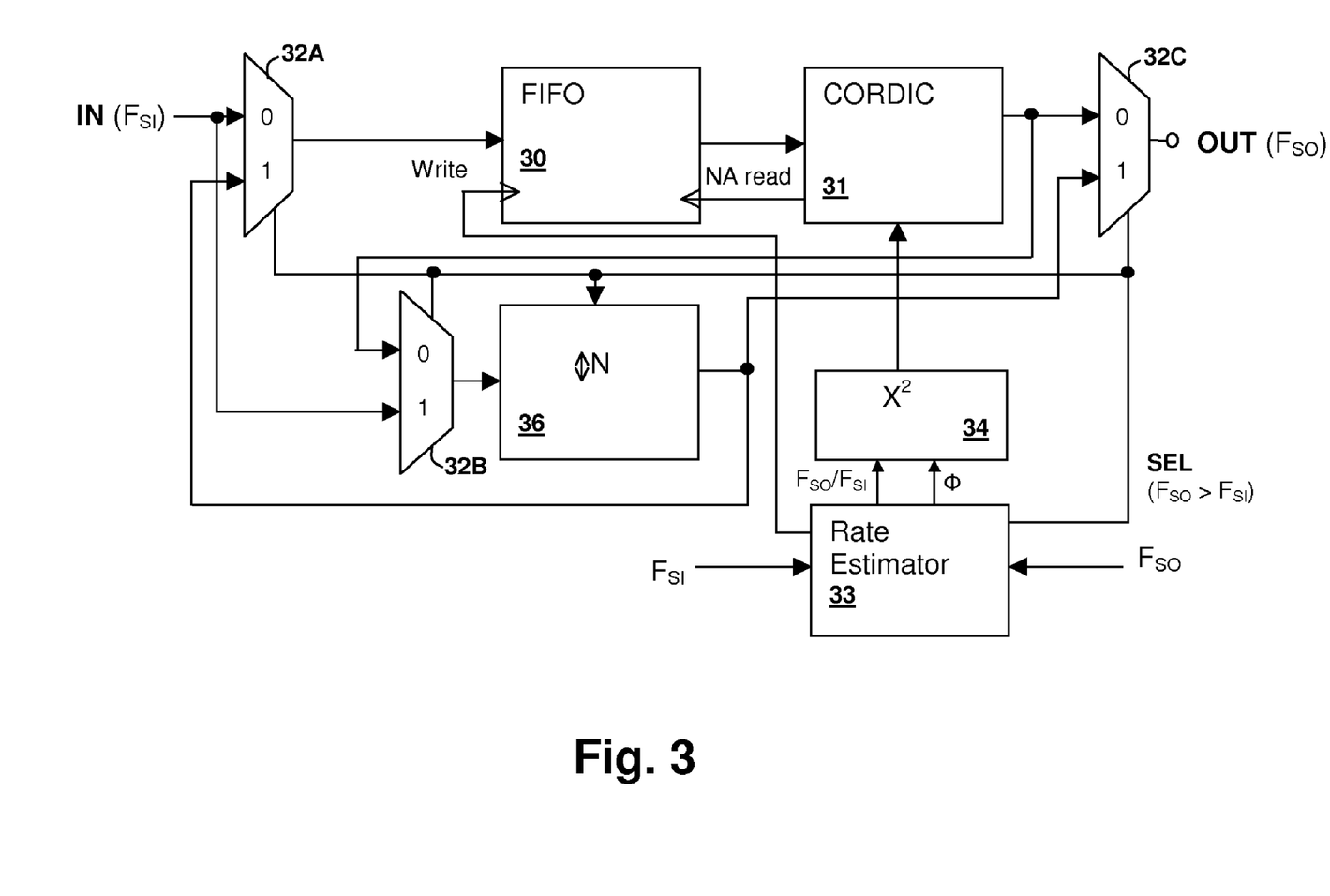
FIG. 3 is a block diagram depicting a sample-rate converter in accordance with yet another embodiment of the present invention.

Referring now to FIG. 3, a sample rate converter is shown that provides the functionality of the sample rate converters of FIG. 1 and FIG. 2, detecting the relationship of the input and output sample rates and adapting the architecture of the circuit to accommodate sample rate ratios greater than or less than unity. For the case of equal sampling rates, in which the converter may be performing a de-jittering function, etc., selection of either of the topologies described below may be made. A rate estimator 33 receives the input sample clock rate $F_{SI}$ and output sample clock rate $F_{SO}$ and generates both the instantaneous phase $\Phi$ and sample rate ratio $F_{SO}/F_{SI}$ that are provided to a squaring unit 34 as described above with respect to FIGS. 1 and 2, but also a select signal SEL. Select signal SEL controls multiplexers 32A, 32B and 32C to re-route various signals within the circuit, in effect, selecting between the toplogies of FIG. 1 and FIG. 2 as appropriate to the relationship between $F_{SO}$ and $F_{SI}$. As mentioned above, for $F_{SO}/F_{SI}=1$, SEL may be assigned to either state and either selectable topology employed for the conversion.

When $F_{SO}<F_{SI}$, select signal SEL=0 and multiplexer 32A supplies the input sample stream $IN(F_{SI})$ to the input of FIFO 30, which supplies non-interpolated data values to CORDIC processing block 31. The output of CORDIC processing block 31 is provided by multiplexer 32B to a decimator/up-sampler 36 that receives select signal SEL and for SEL=0, decimates the output of CORDIC processing block 31 to provide the output sample stream $OUT(F_{SO})$ through multiplexer 32C.

When $F_{SO}>F_{SI}$, select signal SEL=1 and the input sample stream $IN(F_{SI})$ is supplied to the input of decimator/up-sampler 36 through multiplexer 32B. Decimator/up-sampler 36 alsot receives select signal SEL and for SEL=1, upsamples the input sample stream, which is then provided to the input of FIFO 30, through multiplexer 32A. FIFO 30 supplies interpolated data values to CORDIC processing block 31. The output of CORDIC processing block 31 is provided as output sample stream $OUT(F_{SO})$ through multiplexer 32C.

Figure 4:
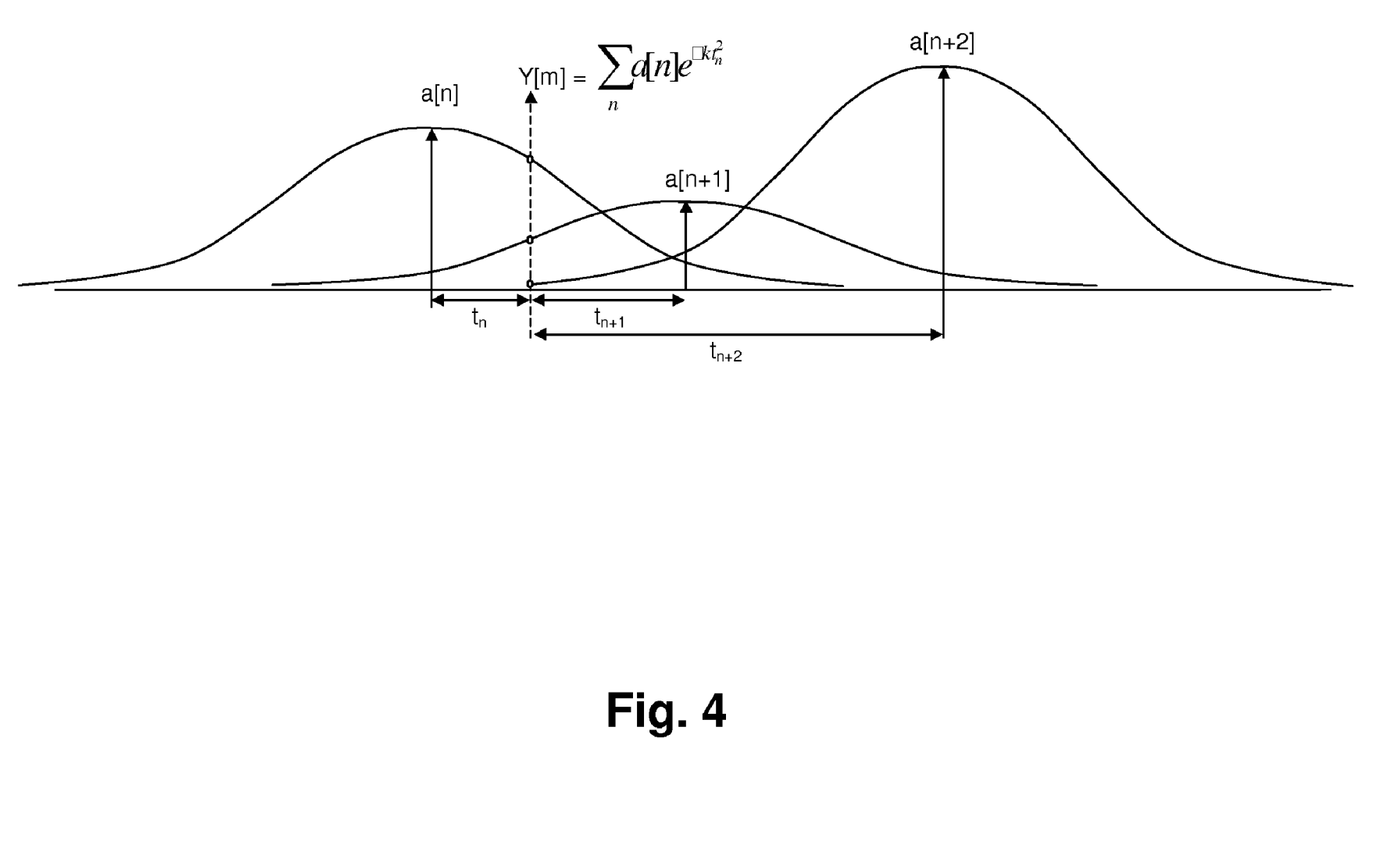
FIG. 4 is a graph depicting the convolution operation performed by the sample-rate converters of FIGS. 1-3.

Referring now to FIG. 4, the operation of CORDIC processing blocks 11, 21 and 31 of FIGS. 1-3 is illustrated in a time/signal diagram. Input sample values a[n], a[n+1] and a[n+2] are illustrated as the peak values of individual gaussian distributions. An output sample value Y[m] is shown and is computed as the sum of the contributions from each of the terms computed by the CORDIC algorithm, i.e., the magnitude of each sample a[n], a[n+1] and a[n+2] (and other samples included in the terms, e.g., a[n+3] and onward and possibly a[n-1] and backward), as modified by their corresponding time displacements $t_n$, $t_{n+1}$ and $t_{n+2}$ from the position of Y[m], according to the CORDIC-computed gaussian distributions. The contributions are shown as the circles indicating the intersection between the arrow representing output sample Y[m] and the distributions around each of input samples a[n], a[n+1] and a[n+2]. In practice, a sufficient number of terms will be used to reduce the truncation error due to the non-included terms to the desirable level of distortion in the output signal. Generally +/−5 samples of a[n] around output sample Y[m] will be sufficient to reduce the distortion error to below the 20-bit level.

Figure 5:
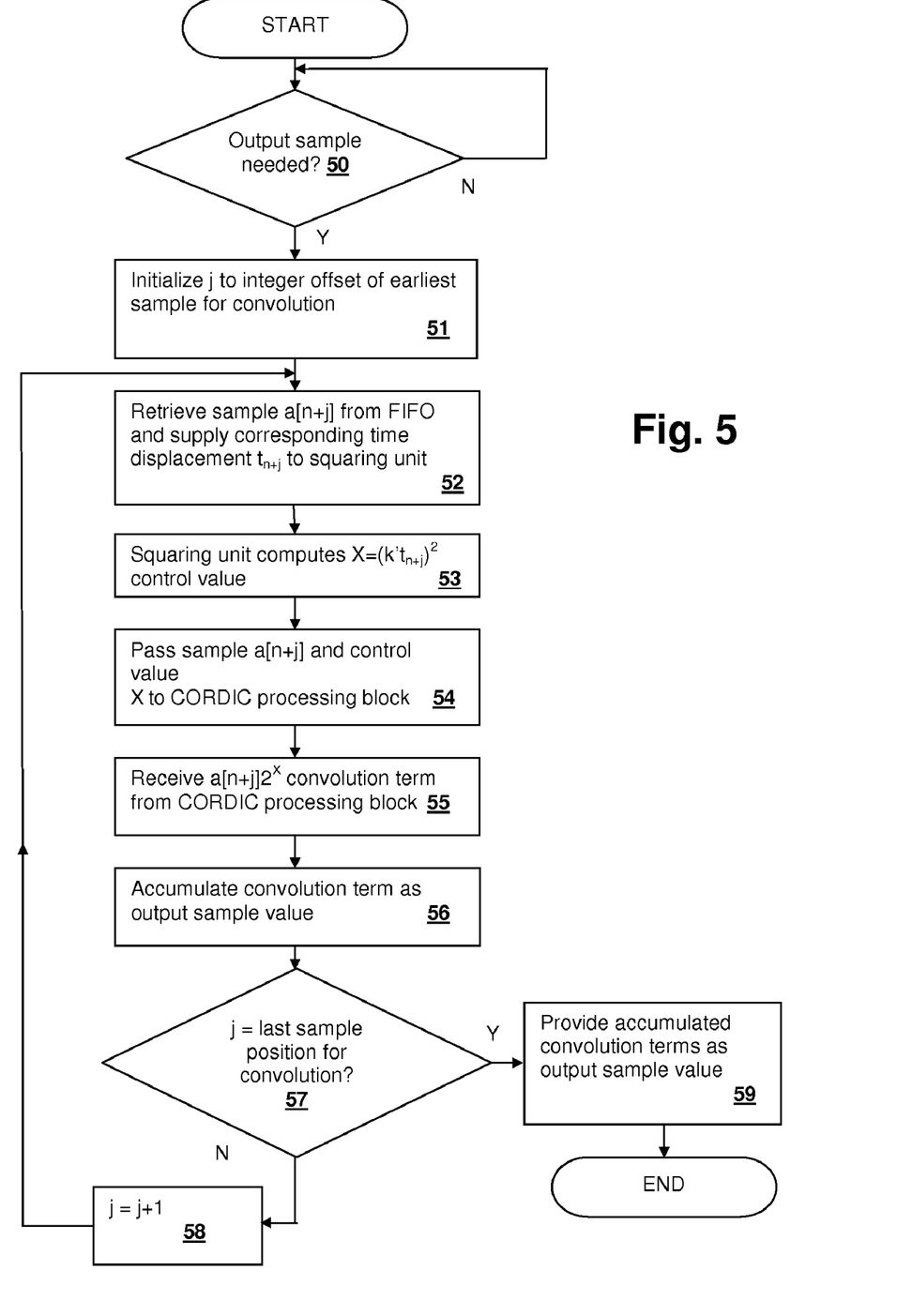
FIG. 5 is a flowchart illustrating a method for sample rate conversion as performed in the circuits of FIGS. 1-3.

Referring now to FIG. 5, a method of sample rate conversion as performed in the above-described sample rate converters is illustrated in a flowchart. When an output sample is needed (decision 50), a count value j is initialized to point to the earliest input sample to be used in the output sample computation (step 51), which can be a negative index. Input sample a[n+j] is retrieved from FIFO 10, 20, or 30 and the corresponding time displacement $t_{n+j}$ is supplied to squaring unit 14, 24 or 34 (step 52). Squaring unit 14, 24 or 34 computes control value $X=(k't_{n+j})^2$ (step 53) and control value X is delivered along with sample a[n+j] to CORDIC processing block 11, 21, or 31 (step 54). CORDIC processing block 11, 21, or 31 returns the computed value $a[n+j]2^X$ (step 55), which is the convolution term corresponding to input sample a[n+j]. The convolution term is accumulated as the output sample value (step 56) and until after j+n has reached the last input sample to be used in the convolution (decision 57), j is incremented (step 58) and steps 51-57 are repeated. When all of the terms have been accumulated (decision 57), the output sample is provided as the accumulation of all the convolution terms (step 59).

Figure 6:
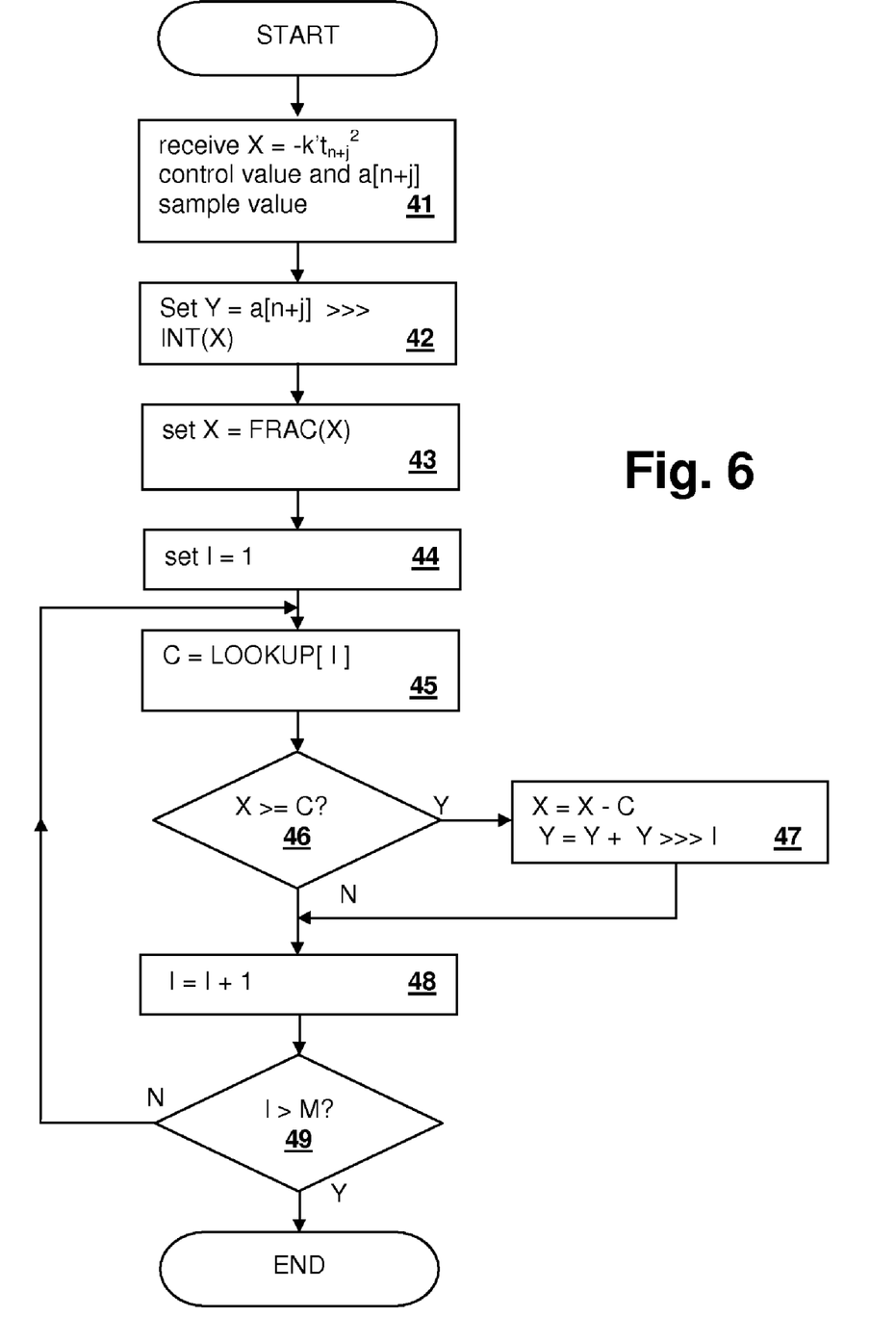
FIG. 6 is a flowchart illustrating a method for computing the gaussian kernel within the CORDIC computation blocks of FIGS. 1-3.

Referring now to FIG. 6, a simplified CORDIC algorithm as may be employed in CORDIC processing blocks 11, 21 and 31 described above, is illustrated in a flowchart. The entire sequence of operations shown in the flowchart is repeated for each convolution term contributing to an output sample value and the input value for each iteration is a different input sample and a control number corresponding to the displacement from the center of the gaussian kernal for each input sample. In the following description and in the flowchart, operator >>> indicates an arithmetic right-shift operation. A pre-computed lookup table is provided with values $LOOKUP[I]=\log_2(1+2^{-I})$, having a predetermined precision according to the depth and width of the lookup table. The lookup table maps integer values of I to the resulting values of an operation according to $\log_2(1+2^{-I})$. The lookup table thus only requires a storage depth equal to the maximum range of I used in the CORDIC computation, generally on the order of 20 or more entries. The storage width is set according to the required precision as noted above.

First, the control value $X=-k't_{j-n}^2$ is received from squaring unit (14, 24, or 34) and input sample value a[n+j] is received from FIFO 10, 20 or 30 (step 41). The control value $X=-k't_{j+n}^2$ is a number representing the phase/time-displacement of the gaussian convolution term being computed, where k' is defined above (in paragraph 0019) as k$\log_2 e$ where $\alpha[n+j]_e^{-kt_{n+j}^2}$ is the exact expression for each gaussian convolution term expression and $t_{n+j}$ is the time displacement between the location of the desired output sample in time and the corresponding input sample a[n+j] as depicted in FIG. 4. For each computed convolution term, the desired output sample contribution value Y is initially set to a[n+j] >>> INT(X) (step 42) and control value X is initially set to the fractional part of X (step 43). The result is that the value of Y is initially set to $a[n+j]^{-INT(X)}$ and then will be adjusted according to further computation that reduces the error in Y according to iterative comparisons of a logarithmic lookup of $\log_2(1+2^{-I})$ to the value of X. An iteration counter I is initialized to 1 (step 44) and the iterative CORDIC computation begins for the convolution term being computed. Value C is set to a lookup logarithm value of LOOKUP[I] (step 45), which returns an approximation of $\log_2(1+2^{-I})$, and if X is greater than or equal to C (decision 46), then X is reduced by C and Y is increased by a power-of-two fraction of Y, (Y>>>I) (step 47). If X is less than C (decision 46), then X and Y are not adjusted. Next, iteration counter I is incremented (step 48) and steps 45-48 are repeated until iteration counter I reaches a predetermined maximum M (decision 49), reducing the error in the computed convolution term until the error is below an acceptable threshold. The resulting computation yields $Y=a[n+j]2^X$, where $X=-k't^2$ to a degree of precision specified by the size of iteration maximum count M.

The CORDIC kernel embodiment illustrated above uses fixed-point operations and storage in order to compute the convolution values required for the sample rate conversion. However, it is contemplated that all of the operations described above can be performed with floating point storage and computation. Thus, an operation such as >>> is understood to be equivalent to subtraction from the exponent field of a floating point number. It is further contemplated, particularly in the floating point domain, that the CORDIC algorithm described above can be replaced with alternative well-known methods and operations for computing logarithms and that the particular base employed in the computations can be 2, "e" or any other base as chosen for a particular implementation, with consequent adjustment in the value of "k".

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A sample rate converter, comprising:
   a digital input node for receiving a first stream of audio samples having a first sampling rate;
   a digital output node for providing a second stream of audio samples having a second sampling rate differing from said first sampling rate; and
   a computation circuit for computing second values within said second stream of audio samples from first values of said first stream of audio samples by convolving said first values with a predetermined number of terms of a kernel having a non-linear and non-polynomial relationship between kernel magnitude and convolution term offset, wherein said computing is performed in real-time as said audio samples of said first stream are received.

2. The sample rate converter of claim 1, wherein said non-linear and non-polynomial relationship is applied to a square of the convolution term offset, whereby said kernel is symmetric around an offset of zero.

3. The sample rate converter of claim 2, wherein said kernel is a gaussian operator.

4. The sample rate converter of claim 3, wherein said computation circuit implements an algorithm employing a logarithmic lookup table.

5. The sample rate converter of claim 3, wherein said computation circuit iteratively applies said logarithmic lookup table to reduce an error residue of a value of said kernel as said value is computed.

6. The sample rate converter of claim 1, wherein said computation circuit implements a simplified CORDIC algorithm.

7. The sample rate converter of claim 1, wherein said computation circuit implements an algorithm employing a logarithmic lookup table.

8. The sample rate converter of claim 7, wherein said computation circuit repeatedly applies said logarithmic lookup table to iteratively reduce an error residue of a value of said kernel as said value is computed.

9. The sample rate converter of claim 1, wherein said computation circuit implements a simplified CORDIC algorithm.

10. The sample rate converter of claim 1, wherein said first sample rate is higher than said second sample rate, and wherein said computation circuit convolves said first stream of audio samples at an intermediate rate that is an integer multiple of said second sample rate to produce an intermediate sample stream, and wherein said sample rate converter further comprises a decimation filter having a decimation factor equal to said integer multiple for decimating said intermediate sample stream to produce said second stream of audio samples.

11. The sample rate converter of claim 1, wherein said first sample rate is lower than said second sample rate, and wherein said sample rate converter further comprises an upsampling interpolation filter having an oversampling ratio equal to a predetermined integer that produces an intermediate sample stream at a sample rate higher than said first sample rate, and wherein said intermediate sample stream is convoluted by said computation circuit at said second sampling rate to produce said second stream of audio samples.

12. The sample rate converter of claim 1, wherein said computation circuit comprises a rate estimator for estimating a ratio between said first sample rate and said second sample rate, and wherein in response to said first sample rate being higher than said second sample rate, said computation circuit convolves said first stream of audio samples at an intermediate rate that is an integer multiple of said second sample rate to produce an intermediate sample stream and decimates said intermediate sample stream to produce said second stream of audio samples, and wherein in response to said first sample rate being lower than said second sample rate, said computation circuit upsamples said first stream of audio samples and convolves said intermediate sample stream at said second sampling rate to produce said second stream of audio samples.

13. A method of performing sample rate conversion, comprising:
   receiving a first stream of samples at a first sample rate;
   in response to said receiving, convolving said first stream of samples with a predetermined number of terms of a kernel having a non-linear and non-polynomial relationship between kernel magnitude and convolution term offset; and
   providing a second stream of samples at a second sample rate in conformity with a result of said convolving.

14. The method of claim 13, wherein said convolving convolves said first stream of samples with a gaussian kernel.

15. The method of claim 13, further comprising computing each of said terms of said kernel using a simplified CORDIC algorithm.

16. The method of claim 13, further comprising in response to said receiving, upsampling said first stream of samples to an intermediate stream of samples having a sample rate equal to said first sample rate multiplied by a predetermined integer, and wherein said convolving is performed by convolving said intermediate stream of samples with said kernel at said second sample rate, and wherein said providing provides a result of said convolving.

17. The method of claim 13, further comprising:

in response to said receiving, convolving said first stream of samples to an intermediate stream of samples at a rate equal to said second sample rate multiplied by a predetermined integer; and decimating said intermediate stream of samples with said kernel at said second sample rate, and wherein said providing provides a result of said decimating.

18. The method of claim 13, further comprising:

determining whether or not said first sample rate is higher than said second sample rate;

in response to determining that said first sample rate is higher than said second sample rate, and further in response to said receiving, convolving said first stream of samples to an intermediate stream of samples at a rate equal to said second sample rate multiplied by a predetermined integer, and decimating said intermediate stream of samples with said kernel at said second sample rate; and in response to determining that said first sample rate is not higher than said second sample rate, and further in response to said receiving, upsampling said first stream of samples to an intermediate stream of samples having a sample rate equal to said first sample rate multiplied by a predetermined integer, and wherein said convolving is performed by convolving said intermediate stream of samples with said kernel at said second sample rate, wherein in response to determining that said first sample rate is higher than said second sample rate, said providing provides a result of said decimating, and wherein in response to determining that said first sample rate is not higher than said second sample rate, said providing provides a result of said convolving.

19. A sample rate converter, comprising:

a digital input node for receiving a first stream of audio samples having a first sampling rate;

a digital output node for providing a second stream of audio samples having a second sampling rate differing from said first sampling rate; and a computation circuit for computing second values within said second stream of audio samples from first values of said first stream of audio samples by convolving said first values with a kernel having a substantially gaussian shape.

20. The sample rate converter of claim 19, wherein said convolving is performed using a predetermined number of terms corresponding to an equal number samples of said first stream of audio samples.

21. The sample rate converter of claim 19, wherein said convolving is performed using a predetermined number of terms corresponding to an equal number samples of an intermediate stream up-sampled from said first stream of audio samples.

22. A method of performing sample rate conversion, comprising:

receiving a first stream of samples at a first sample rate;

in response to said receiving, convolving said first stream of samples with a gaussian kernel; and providing a second stream of samples at a second sample rate in conformity with a result of said convolving.

23. The method of claim 22, wherein said convolving is performed using a predetermined number of terms corresponding to an equal number samples of said first stream of audio samples.

24. The method of claim 22, wherein said convolving is performed using a predetermined number of terms corresponding to an equal number samples of an intermediate stream up-sampled from said first stream of audio samples.

* * * * *